(12) United States Patent
Fujikura et al.

(10) Patent No.: US 6,989,287 B2
(45) Date of Patent: Jan. 24, 2006

(54) METHOD FOR PRODUCING NITRIDE SEMICONDUCTOR, SEMICONDUCTOR WAFER AND SEMICONDUCTOR DEVICE

(75) Inventors: Hajime Fujikura, Tsukuba (JP); Kazuyuki Iizuka, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/875,101

(22) Filed: Jun. 24, 2004

(65) Prior Publication Data
US 2005/0042789 A1    Feb. 24, 2005

(30) Foreign Application Priority Data
Jun. 27, 2003  (JP)  ............................. 2003-185486

(51) Int. Cl.
*H01L 21/00*      (2006.01)
*H01L 21/338*    (2006.01)
(52) U.S. Cl. ..................... 438/47; 438/94; 438/167; 438/172; 438/28
(58) Field of Classification Search ............ 438/26, 438/28, 29, 47, 94, 167, 172
See application file for complete search history.

(56) References Cited

U.S. PATENT DOCUMENTS

| | | | |
|---|---|---|---|
| 6,225,650 B1 * | 5/2001 | Tadatomo et al. | 257/190 |
| 6,288,416 B1 * | 9/2001 | Koike et al. | 257/94 |
| 6,555,403 B1 * | 4/2003 | Domen et al. | 438/22 |
| 6,709,881 B2 * | 3/2004 | Hasegawa et al. | 438/24 |
| 2004/0061119 A1 * | 4/2004 | Inoue et al. | 257/79 |

FOREIGN PATENT DOCUMENTS

JP    04-297023    10/1992
JP    8-8217       1/1996

* cited by examiner

*Primary Examiner*—Jennifer M. Kennedy
(74) *Attorney, Agent, or Firm*—Sughrue Mion, PLLC

(57) ABSTRACT

A method for producing a nitride semiconductor comprising growing at least first to third nitride semiconductor layers on a substrate; said first nitride semiconductor layer being grown at 400–600° C.; and said second and third nitride semiconductor layers being grown on said first nitride semiconductor layer at 700–1,300° C. after heat-treating said first nitride semiconductor layer at 700–1,300° C.; used as a carrier gas supplied near said substrate together with a starting material gas being a hydrogen/nitrogen mixture gas containing 63% or more by volume of hydrogen during growing said second nitride semiconductor layer, and a hydrogen/nitrogen mixture gas containing 50% or more by volume of nitrogen during growing said third nitride semiconductor layer; and said second nitride semiconductor layer being formed to a thickness of more than 1 μm.

15 Claims, 10 Drawing Sheets

Pressure During Growth of GaN Layer in Step (c) (Torr)

Pressure During Growth of GaN Layer in Steps (a) and (b) (Torr)

In Content (x) of $In_xGa_{1-x}N$ in Step (a)

METHOD FOR PRODUCING NITRIDE SEMICONDUCTOR, SEMICONDUCTOR WAFER AND SEMICONDUCTOR DEVICE

FIELD OF THE INVENTION

The present invention relates to a method for producing a nitride semiconductor having a small dislocation density, a nitride semiconductor wafer having a nitride semiconductor formed by such a method, and a nitride semiconductor device produced therefrom.

BACKGROUND OF THE INVENTION

The easiest method for forming an epitaxial semiconductor layer is generally to form a single crystal substrate made of the same material as that of a semiconductor to be grown, and to cause a vapor-phase growth of a semiconductor crystal on the resultant substrate, with actual success in various materials. However, because the single crystal substrate is not only technically difficult to obtain but also high in cost, a semiconductor crystal different from the substrate should often be grown on the substrate. In such a case, known combinations of the substrates and the semiconductor crystals are, for instance, GaAs on a silicon substrate, a nitride semiconductor on a sapphire or silicon carbide substrate, II–VI group semiconductors on a GaAs substrate, etc.

However, when a semiconductor different from a substrate is grown on the substrate, dislocations are likely introduced in a high density into a grown epitaxial semiconductor layer because of the mismatch of various characteristics such as lattice, a thermal expansion coefficient, surface energy, etc. Because the dislocations in the semiconductors may constitute non-radiative recombination centers, scattering centers, etc. in semiconductor devices such as optical devices, electronic devices, etc., devices using high-dislocation-density semiconductors are extremely poor in characteristics and stability.

Because bulk crystal growth is also difficult in a nitride semiconductor typically including gallium nitride (GaN), aluminum gallium nitride (AlGaN), indium gallium nitride (InGaN), etc., the technology for producing single crystal substrates with practically acceptable sizes at a low cost have not been established yet. Accordingly, methods for causing nitride semiconductor crystals to grow epitaxially on substrates such as sapphire, silicon carbide, etc. are generally used. Still, dislocations remain serious problems as described above.

Under such circumstances, JP 8-8217 B proposes a method for reducing a dislocation density in a nitride semiconductor layer by "a two-stage growing method" using a metal-organic vapor-phase epitaxy method (MOVPE method). In this method, after a hydrogen gas is blown at as high a temperature as 1000° C. or higher onto a substrate surface of sapphire, etc. to remove an oxide film from the surface (heat cleaning), (a) a low-temperature buffer layer made of GaN, AlN, etc. is grown at 500–600° C. on the substrate, (b) the temperature is elevated to about 1000° C. for a heat treatment, and (c) a nitride semiconductor layer made of GaN, etc. is grown at about 1000° C. In the step (a), the crystal-growing temperature is lower than the melting point of GaN, AlN, etc., resulting in the formation of a polycrystalline, low-temperature buffer layer. In the subsequent step (b), the low-temperature buffer layer is partially turned to a single crystal by elevating the temperature to about 1000° C. to form fine crystal particles. In the step (c), an epitaxial layer made of GaN, etc. is formed with these fine crystal particles as nuclei. According to this method, the dislocation density of GaN on a sapphire substrate can be reduced from the level of conventional methods ($10^{10}$–$10^{11}$ per 1 $cm^2$) to about $10^9$ per 1 $cm^2$.

As a method for reducing a dislocation density to $10^9$ per 1 $cm^2$ or less in a GaN semiconductor layer formed on a sapphire substrate, the inventors proposed a method of carrying out the following three steps of:

(i) forming fine crystal particles made of a nitride semiconductor on a substrate;

(ii) forming a nitride semiconductor island structure having pluralities of facets inclined relative to a surface of the substrate with the fine crystal particles as nuclei having a thickness of 0.1 to 1 μm; and (iii) causing the nitride semiconductor island structure to grow in a direction parallel with a surface of the substrate to merge pluralities of the nitride semiconductor island structures with each other, thereby forming a nitride semiconductor crystal layer having a flat surface, under different conditions (method of prior invention), by U.S. Ser. No. 10/396,831 (filed on Mar. 26, 2003).

This method succeeds in making the dislocation density as small as $5 \times 10^7$ per 1 $cm^2$ at minimum. To reduce the dislocation density to a level of $10^7$ per 1 $cm^2$ in this method, however, it is necessary to accelerate the growth of the above nitride semiconductor crystal in an island manner by adding Si at as high a concentration as $5 \times 10^{19}$ atoms/$cm^3$ to the crystal in the step of growing the nitride semiconductor having an island structure, or to cover the substrate surface partially with an Si layer by exposing the substrate surface to a gas containing an Si compound at a high concentration, and then cause fine crystal particles of the nitride semiconductor to grow on the coated Si layer.

Because a gas containing an Si compound at a high concentration should be introduced into a crystal-growing apparatus in these Si-using methods, Si remains on an inner wall of the crystal-growing apparatus, causing the problem that layers growing in subsequent steps, which should not contain Si, are contaminated with Si. On the other hand, the minimum dislocation density of a nitride semiconductor obtained by methods using no Si is as high as $1 \times 10^8$ per 1 $cm^2$, failing to be reduced to a sufficient level.

OBJECTS OF THE INVENTION

Accordingly, an object of the present invention is to provide a method for producing a nitride semiconductor having a dislocation density of $1 \times 10^8$ or less per 1 $cm^2$ without adding Si at a high concentration.

Another object of the present invention is to provide a nitride semiconductor wafer and a nitride semiconductor device comprising a nitride semiconductor obtained by such a method, which are not contaminated with the remaining Si.

DISCLOSURE OF THE INVENTION

As the result of intensive research in view of the above objects, the inventors have found that the contamination of a crystal with the remaining Si, which is caused by adding Si at a high concentration, can be avoided, and a dislocation density in the resultant nitride semiconductor crystal can be suppressed to a level of $10^6$ to $10^7$ per 1 $cm^2$, by changing the above steps (i) to (iii) to the following steps:

(a) forming fine crystal particles made of a nitride semiconductor on a substrate by growth of a low-temperature buffer layer and heat treatment thereof, (b) forming a nitride semiconductor island structure having a thickness of 1 µm or more and pluralities of facets inclined relative to a surface of the substrate with the fine crystal particles as nuclei, and (c) causing the nitride semiconductor layer of the island structure to grow in a direction parallel with a surface of the substrate to merge pluralities of the nitride semiconductor island structures with each other, thereby forming a nitride semiconductor crystal layer having a flat surface. The present invention has been completed based on this finding. In the present invention, the dislocation density can be suppressed to about $10^6$ to $10^7$ per 1 $cm^2$ without using Si, by causing the layer to grow as thick as more than 1 µm in the step (b).

Thus, the method for producing a nitride semiconductor according to the present invention comprises growing at least first to third nitride semiconductor layers on a substrate; the first nitride semiconductor layer being grown at 400–600° C.; and the second and third nitride semiconductor layers being grown on the first nitride semiconductor layer at 700–1,300° C. after heat-treating the first nitride semiconductor layer at 700–1,300° C.; used as a carrier gas supplied near the substrate together with a starting material gas being a hydrogen/nitrogen mixture gas containing 63% or more by volume of hydrogen during growing the second nitride semiconductor layer, and a hydrogen/nitrogen mixture gas containing 50% or more by volume of nitrogen during growing the third nitride semiconductor layer; and the second nitride semiconductor layer being formed to a thickness of more than 1 µm.

The thickness of the second nitride semiconductor layer is preferably 2.25 µm or more. The thickness of the first nitride semiconductor layer is preferably 5 to 42 nm, more preferably 5 to 22 nm. The crystal surface of the third nitride semiconductor layer is substantially flat at a thickness of 500 to 10,000 nm, and flatter at a thickness of 2,000 to 6,000 nm.

The carrier gas used for growing the second nitride semiconductor layer is preferably a hydrogen/nitrogen mixture gas containing 82% or more by volume of hydrogen, and more preferably pure hydrogen. The carrier gas used for growing the third nitride semiconductor layer is preferably a hydrogen/nitrogen mixture gas containing 70% or more by volume of nitrogen.

The growing speed of the second nitride semiconductor layer is preferably 4.8 µm/hour or less, more preferably 2.6 µm/hour or less. The growing speed of the third nitride semiconductor layer is preferably 2.2 to 10.9 µm/hour, more preferably 3.1 to 5.8 µm/hour. The pressure for growing the third nitride semiconductor layer is preferably 112 to 800 Torr, more preferably 195 to 410 Torr. The pressure for growing the first and second nitride semiconductor layers is preferably 615 Torr or more.

The difference in a growing temperature between the second and third nitride semiconductor layers is preferably 100° C. or less. When ammonia is used as a nitrogen source, the flow rate of ammonia supplied to grow the second nitride semiconductor layer is preferably equal to or less than that of ammonia supplied to grow the third nitride semiconductor layer.

A single crystal of sapphire, silicon carbide, silicon, $ZrB_2$, ZnO, $LiGaO_2$ or $LiAlO_2$ may be used for the substrate. Each of the first to third nitride semiconductor layers is preferably made of $In_xAl_yGa_zN$ (x≧0, y≧0, z≧0, x+y+z=1), more preferably, for instance, $In_xGa_{1-x}N$ (0≦x≦0.3) or GaN. At least one of the first to third nitride semiconductor layers may be undoped, or doped with silicon, oxygen, iron, zinc or magnesium. In the case of a doped layer, its doping concentration is preferably $5×10^{19}$ atoms or less per 1 $cm^3$.

The nitride semiconductor wafer of the present invention comprises a nitride semiconductor produced by the method of the present invention, which comprises pluralities of semiconductor layers on a third nitride semiconductor layer.

The nitride semiconductor device of the present invention comprises a nitride semiconductor produced by the method of the present invention with a device structure on a third nitride semiconductor layer. The nitride semiconductor device of the present invention is particularly an ultraviolet-emitting device.

The "thickness" and "growing speed" of the above first to third nitride semiconductor layers are defined as follows: As shown in FIG. 1, the first to third nitride semiconductor layers do not grow in a laminar manner at a uniform thickness in the production method of the present invention. On the other hand, when a flat nitride semiconductor layer is formed on a sapphire substrate by a conventional two-stage growing method, and a nitride semiconductor layer is then grown thereon under the same conditions as in the method of the present invention, it is possible to obtain a flat nitride semiconductor layer in a range of the growing conditions. In view of this, the "thickness" and "growing speed" of nitride semiconductor layers grown on a flat nitride semiconductor layer under the same conditions as in the growth of the first to third nitride semiconductor layers are defined herein as the "thickness" and "growing speed" of the first to third nitride semiconductor layers.

DETAILED DESCRIPTION OF THE PREFERRED EMBODIMENTS

Figure 1:
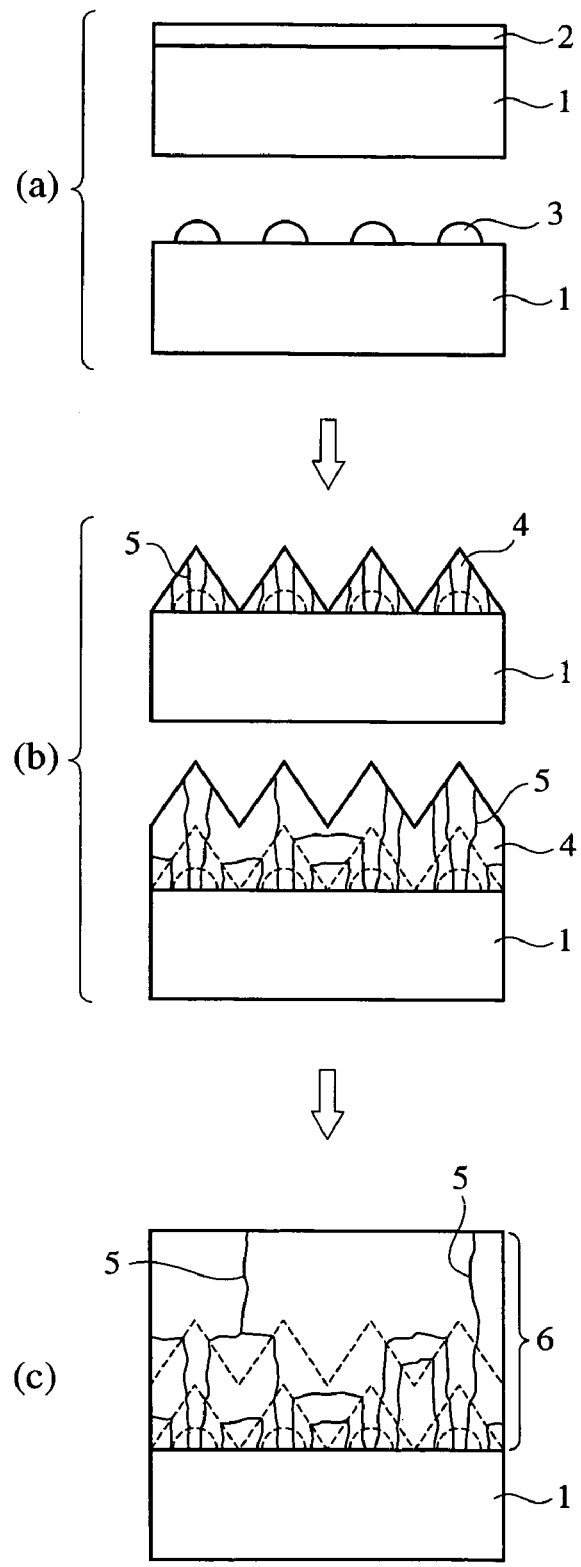
FIG. 1 is a schematic cross-sectional view showing the structure of a nitride semiconductor crystal at each step of the production method of the present invention.

FIG. 1 shows the cross-sectional structure of a nitride semiconductor crystal in each step. In the step (a), a low-temperature buffer layer 2 of a nitride semiconductor is formed on a substrate 1 such that it forms fine crystal particles 3 of a nitride semiconductor by a heat treatment. Even though there is large mismatch in material properties between the substrate 1 and the nitride semiconductor, it is possible to keep a state in which atoms constituting the nitride semiconductor crystal are bonded to each other without disturbance, as long as the nitride semiconductor crystal is in contact with the substrate in a small area, whereby no dislocation is introduced into the fine crystal particles 3.

In the step (b), a nitride semiconductor island structure 4 having pluralities of facets inclined relative to a substrate surface is formed with the resultant fine crystal particles 3 as nuclei. Dislocations 5 are introduced into the nitride semiconductor island structure 4, because the nitride semiconductor island structure 4 has a large area in which the crystal is in contact with the substrate. The dislocations 5 propagate to the facets in a direction perpendicular to the substrate surface. As shown in FIG. 1, the dislocations 5 reaching the facets are likely to change their propagation directions to parallel with the substrate surface with a certain probability. When the dislocations 5 propagating in a direction parallel with the substrate surface are combined with each other, they form loops or merge to one dislocation, resulting in decrease in a dislocation density. Accordingly, the density of dislocations appearing on the surface of the crystal layer 6 decreases.

Because the change of the propagation direction of the dislocations 5 occurs with certain probability as described above, it is necessary to form a thick nitride semiconductor island structure 4 in the step (b) to reduce the dislocations 5 on the surface of the final crystal layer 6. Though such an island structure is formed at an early stage of growth even by the conventional two-stage growing method, the island structure is not kept long under the conventional conditions, so that a growing surface becomes flat soon, resulting in a limited effect of reducing dislocations. In the conventional two-stage growing method, the island structure is kept typically until it grows to a thickness of about 500 nm from the start of the growth of the nitride semiconductor layer.

Because the nitride semiconductor is grown to a thickness of 0.1 to 1 $\mu$m in the step (b) in the prior invention, too, the effect of reducing dislocations is limited. The most important feature of the present invention is that the second nitride semiconductor layer is grown thicker than 1 $\mu$m in the step (b) to keep the island structure longer, thereby achieving a larger effect of reducing dislocations.

In the first growing stage of the nitride semiconductor island structure 4, the dislocations 5 propagate to the facets in a direction perpendicular to the substrate surface. It is preferable that the nitride semiconductor island structure 4 comprises substantially polygonal pyramids to make the dislocations 5 reach the facets. A nitride semiconductor island structure 4 in a shape of a polygonal pyramid may not be formed depending on the growing conditions, but an island structure consisting of facets perpendicular to the substrate and facets parallel with the substrate may be formed. In this case, however, the dislocations 5 on the surface of the nitride semiconductor crystal layer 6 are not drastically decreased.

In the step (c), the nitride semiconductor island structures 4 are grown in parallel to the surface of the substrate 1 to combine pluralities of nitride semiconductor island structure 4 with each other, thereby forming a nitride semiconductor crystal layer 6 having a flat surface. As a result, a nitride semiconductor wafer having a flat surface is provided with a low dislocation density throughout the substrate.

The nitride semiconductor crystal is grown preferably in a vapor-phase growing apparatus, for instance, in a metal-organic vapor-phase epitaxy (MOVPE) apparatus or a hydride vapor-phase epitaxy (HVPE) apparatus. Nitride semiconductor crystals with good crystallinity can be grown by an MOVPE method, while nitride semiconductor crystals can be grown efficiently by an HVPE method because of a high crystal-growing speed. The conditions of the MOVPE method and the HVPE method may be properly selected. The MOVPE method may be combined with the HVPE method; for instance, a nitride semiconductor crystal is first grown epitaxially on the substrate by the MOVPE method to form fine crystal particles [step (a)], and crystal growth thereon can then be conducted in the steps (b) and (c) by the HVPE method.

In the step (a), the first nitride semiconductor layer is grown on the substrate at 400–600° C., and the resultant first nitride semiconductor layer is heat-treated at 700–1,300° C. When the growing temperature is lower than 400° C., a crystal is less likely to grow. On the other hand, when the growing temperature is higher than 600° C., a single crystal is formed, making it difficult to form fine crystal particles. When the heat treatment temperature for the first nitride semiconductor layer is lower than 700° C., the first nitride semiconductor layer is not turned to fine crystal particles. On the other hand, when the heat treatment temperature is higher than 1,300° C., fine crystal particles are vaporized.

In the steps (b) and (c), the second nitride semiconductor layer is grown on the first nitride semiconductor layer at 700–1,300° C. When the growing temperature is less than 700° C., a deep level is undesirably introduced into crystals when applied to devices. On the other hand, when the growing temperature is higher than 1,300° C., the surface roughness (root-mean-square value) of the resultant nitride semiconductor layer exceeds 20 nm, unsuitable for use in devices.

The thickness of the second nitride semiconductor layer is more than 1 $\mu$m, preferably 2.25 $\mu$m or more. As described above, the thicker the second nitride semiconductor layer, the longer the island structure is kept, resulting in a larger effect of reducing dislocations. Though not particularly restrictive, the upper limit of the thickness of the second nitride semiconductor layer is preferably about 5 $\mu$m. Even though the second nitride semiconductor layer is grown more, drastic decrease in dislocations is not achieved.

The carrier gas used for growing the second nitride semiconductor layer is a hydrogen/nitrogen mixture gas containing 63% or more by volume of hydrogen, preferably a hydrogen/nitrogen mixture gas containing 82% or more by volume of hydrogen, more preferably pure hydrogen. A high concentration of hydrogen in the carrier gas accelerates the island-shape growth of the second nitride semiconductor layer, providing a stable island structure.

The carrier gas used for growing the third nitride semiconductor layer is a hydrogen/nitrogen mixture gas containing 50% or more by volume of nitrogen, and preferably a hydrogen/nitrogen mixture gas containing 70% or more by volume of nitrogen. The nitrogen concentration in the carrier gas may be 100% by volume. A high concentration of nitrogen accelerates the flattening of the nitride semiconductor surface.

The growing speed of the second nitride semiconductor layer is preferably 4.8 $\mu$m, hour or less, more preferably 2.6 $\mu$m/hour or less. The slower the growing speed of the second nitride semiconductor layer, the more the island-shape growth is promoted, resulting in a stable island structure. Though not particularly restrictive, the lower limit of the growing speed of the second nitride semiconductor layer is preferably about 1 $\mu$m/hour from the aspect of production efficiency.

The growing speed of the third nitride semiconductor layer is preferably 2.2 to 10.9 $\mu$m/hour, more preferably 3.1 to 5.8 $\mu$m/hour. Though a high growing speed accelerates the flattening of the third nitride semiconductor layer, too fast growing makes the surface of the third nitride semiconductor layer rougher.

The pressure applied during the growth of the first and second nitride semiconductor layers is preferably 615 Torr or more. The greater the pressure during the growth, the more accelerated the island-shape growth, resulting in keeping the island structure for a longer period of time. Though not particularly restrictive, the upper limit of the pressure during the growth is preferably about 1520 Torr from the aspect of general pressure resistance of a crystal-growing apparatus The pressure applied during the growth of the third nitride semiconductor layer is preferably 112 to 800 Torr, more preferably 195 to 410 Torr. Though the surface of the third nitride semiconductor layer is made flatter at lower pressure than 410 Torr, surface flattening can be achieved even at about atmospheric pressure. However, too low pressure during the growth crystal is likely to form a deep level undesirable for devices. The formation of a deep level is remarkable at lower pressure than 112 Torr and negligible at pressure of 195 Torr or more during the growth.

The thickness of the first nitride semiconductor layer is preferably 5 to 42 nm, more preferably 5 to 22 nm. A thinner first nitride semiconductor provides a lower density of fine crystals, resulting in a larger island structure formed by the growth of the second nitride semiconductor layer. As a result, the island structure is kept longer, providing a larger effect of reducing dislocations. However, when the first nitride semiconductor layer is thinner than 5 nm, the first nitride semiconductor layer undesirably completely disappears by a heat treatment for forming fine crystals.

The thickness of the third nitride semiconductor layer is preferably 500 to 10,000 nm, more preferably 2,000 to 6,000 nm. When a thick third nitride semiconductor layer is grown on the nitride semiconductor island structure, the surface flatness of the nitride semiconductor is gradually improved. However, a too thick third nitride semiconductor layer rather deteriorates the surface flatness of the nitride semiconductor. It is presumed that the deterioration of the surface flatness of the third nitride semiconductor layer due to increase in its thickness is caused by the fact that the substrate is bent as the third nitride semiconductor layer becomes thicker, resulting in the growing conditions deviating from the optimum ones. Specifically, when the third nitride semiconductor is as thick as 500 to 10,000 nm, a substantially flat surface (root-mean-square value<20 nm) can be obtained, and when it is as thick as 2,000 to 6,000 nm, a flatter surface (root-mean-square value<10 nm) can be obtained.

The difference in a growing temperature between the second nitride semiconductor layer and the third nitride semiconductor layer is preferably 100° C. or less. The growing temperature of the third nitride semiconductor layer is more preferably substantially the same as that of the second nitride semiconductor layer. The higher the growing temperature of the third nitride semiconductor layer, the flatter nitride semiconductor surface is obtained, improving the surface flatness of a final product. However, when the growing temperature of the third nitride semiconductor layer is higher than the growing temperature of the second nitride semiconductor layer by much more than 100° C., the third nitride semiconductor layer is deprived of nitrogen on the surface, resulting in surface roughening. On the other hand, when the third nitride semiconductor layer is grown at lower pressure than in the growth of the second nitride semiconductor layer, the deprivation of nitrogen on the surface of the third nitride semiconductor layer is generally more accelerated, though depending on the structure of the crystal-growing apparatus. Accordingly, the growing temperature of the third nitride semiconductor layer should sometimes be lower than in the growth of the second nitride semiconductor layer. In this case, it is possible to suppress the deprivation of nitrogen on the surface of the third nitride semiconductor layer, by lowering the growing temperature of the third nitride semiconductor layer. However, when the growing temperature of the third nitride semiconductor layer is lower than in the growth of the second nitride semiconductor by much more than 100° C., the flattening of the nitride semiconductor surface is undesirably retarded.

The substrate is preferably a single crystal substrate of sapphire, silicon carbide, silicon, $ZrB_2$, ZnO, $LiGaO_2$ or $LiAlO_2$. Each of the first to third nitride semiconductor layers is preferably made of $In_xAl_yGa_zN$ ($x \geq 0$, $y \geq 0$, $z \geq 0$, $x+y+z=1$). It is more preferable that the first nitride semiconductor layer is made of $In_xGa_{1-x}N$ ($0 \leq x \leq 0.3$), the second nitride semiconductor layer is made of GaN, and the third nitride semiconductor layer is made of GaN.

At least one of the first to third nitride semiconductor layers may be undoped, or doped with silicon, oxygen, iron, zinc or magnesium. Particularly in the case of a silicon-doped layer, an oxygen-doped layer, an iron-doped layer, a zinc-doped layer or a magnesium-doped layer, its doping concentration is preferably $5\times10^{19}$ atoms or less per 1 $cm^3$. Too high a doping concentration causes the above-described contamination of a crystal with Si, and deteriorates the surface flatness of the final nitride semiconductor.

The nitride semiconductor wafer of the present invention comprises the nitride semiconductor crystal layer 6 formed on the substrate by the method of the present invention with pluralities of semiconductor layers formed thereon. The production method of the present invention provides a high-performance nitride semiconductor wafer because of a dislocation density of $1\times10^8$ or less per 1 $cm^2$ on the entire surface of the nitride semiconductor crystal layer 6. Plural semiconductor layers formed on the nitride semiconductor crystal layer 6 are properly selected depending on the applications of the semiconductor wafer. Plural semiconductor layers may be successively formed in the same crystal-growing apparatus where the nitride semiconductor crystal layer 6 is formed, or in a different crystal-growing apparatus. The semiconductor wafer of the present invention may be subjected to grinding, etching, heat treatment, etc. in addition to the formation of the semiconductor layers.

The semiconductor device of the present invention is manufactured by using the nitride semiconductor wafer of the present invention. The nitride semiconductor wafer of the present invention may be provided with electrodes by vapor deposition, sputtering, etc., and subjected to surface oxidation, doping, photolithography, etching, washing, dicing, assembling, etc., to obtain nitride semiconductor devices such as transistors (high-electron-mobility transistors (HEMTs), field-effect transistors (FETs), etc.), light-emitting diodes (LEDs), laser diodes (LDs), etc. The nitride semiconductors obtained by the method of the present invention are particularly suitable for ultraviolet-emitting device wafers and ultraviolet-emitting devices formed using them.

The present invention will be explained in detail referring to Examples below without intention of restricting the present invention thereto.

EXAMPLE 1

GaN semiconductor layers were grown as first to third nitride semiconductor layers on a C face of a sapphire substrate having a diameter of 50.8 mm and a thickness of 330 $\mu$m by an MOVPE method under the conditions shown in Table 1. The procedure in each step is as follows:

(1) Thermal Cleaning Step

The substrate was placed in an MOVPE apparatus and heated at 1135° C. for 10 minutes in an atmosphere of a carrier gas composed of a hydrogen/nitrogen mixture gas (total flow rate=150 slm, the concentration of hydrogen=33% by volume) at 760 Torr to remove oxides, etc. from the substrate surface.

(2) Step (a)

With the substrate temperature lowered to 515° C., the flow rate of the carrier gas lowered to 140 slm, and the concentration of hydrogen in the carrier gas lowered to 29% by volume, an ammonia ($NH_3$) gas as a nitrogen source was introduced in a flow rate of 10 slm into a crystal-growing apparatus. Further, a trimethyl gallium (TMG) as a Ga source was introduced into the crystal-growing apparatus, to grow a GaN semiconductor layer (low-temperature buffer layer) having a thickness of 20 nm at a speed of 1.9 $\mu$m/hour on the substrate. The GaN semiconductor layer was then heat-treated under the following conditions: the carrier gas flow rate lowered to 80 slm, the concentration of hydrogen in the carrier gas at 29% by volume, the flow rate of ammonia increased to 20 slm, and the substrate temperature elevated to 1075° C., to form fine crystal particles of a GaN semiconductor on the substrate.

(3) Step (b)

When the heat treatment of the GaN semiconductor layer was completed, the concentration of hydrogen in the carrier gas was increased to 82% by volume to grow a GaN semiconductor layer of an island structure at a speed of 2.2 $\mu$m/hour. As shown in Table 1, a GaN semiconductor layer having a thickness of 2250 nm (2.25 $\mu$m) was obtained by the step (b).

(4) Step (c)

The pressure in the apparatus was lowered to 300 Torr while growing the GaN semiconductor layer, and the flow rate of the carrier gas was changed to 130 slm, the concentration of hydrogen in the carrier gas was changed to 23% by volume, and the substrate temperature was changed to 1005° C., to grow a GaN semiconductor layer to a thickness of 3000 nm at a speed of 3.1 $\mu$m/hour, thereby flattening the GaN semiconductor surface. After the completion of growing, the substrate temperature was lowered to 200° C. or less. After the crystal-growing apparatus was filled with a nitrogen gas at 760 Torr, the substrate was then taken out of the crystal-growing apparatus.

The resultant GaN epitaxial wafer had a mirror surface. A dislocation density determined by transmission electron microscopic (TEM) observation was $5\times10^7$ per 1 $cm^2$ on the surface of the GaN semiconductor layer. This dislocation density was 1/20 of the dislocation density ($1\times10^9$ per 1 $cm^2$) of a GaN epitaxial wafer obtained by the conventional two-stage growing method, and the same as the minimum dislocation density in the prior invention, which was obtained by a method comprising partially covering the substrate surface with an Si layer, and forming fine crystal particles on the Si covering layer.

TABLE 1

| | | Step (a) | | Step (b) | Step (c) |
|---|---|---|---|---|---|
| Parameters | Thermal Cleaning Step | First Nitride Semiconductor Layer | Heat Treatment | Second Nitride Semiconductor Layer | Third Nitride Semiconductor Layer |
| $FR^{(1)}$ of Carrier Gas (slm) | 150 | 140 | 80 | 80 | 130 |
| $FR^{(1)}$ of Ammonia (slm) | 0 | 10 | 20 | 20 | 20 |

TABLE 1-continued

| Parameters | Step (a) | | | Step (b) | Step (c) |
| --- | --- | --- | --- | --- | --- |
| | Thermal Cleaning Step | First Nitride Semiconductor Layer | Heat Treatment | Second Nitride Semiconductor Layer | Third Nitride Semiconductor Layer |
| Conc.of $H_2$ (vol. %)[(2)] | 33 | 29 | 29 | 82 | 23 |
| Pressure (Torr) | 760 | 760 | 760 | 760 | 300 |
| Temperature (° C.) | 1135 | 515 | 1075 | 1075 | 1005 |
| Semiconductor Layer | — | GaN | — | GaN | GaN |
| Growing Speed ($\mu$m/hour) | — | 1.9 | — | 2.2 | 3.1 |
| Thickness (nm) | — | 20 | — | 2250 | 3000 |

Note:
[(1)]Flow rate.
[(2)]The concentration of hydrogen in the carrier gas (% by volume).

EXAMPLE 2

Figure 2:
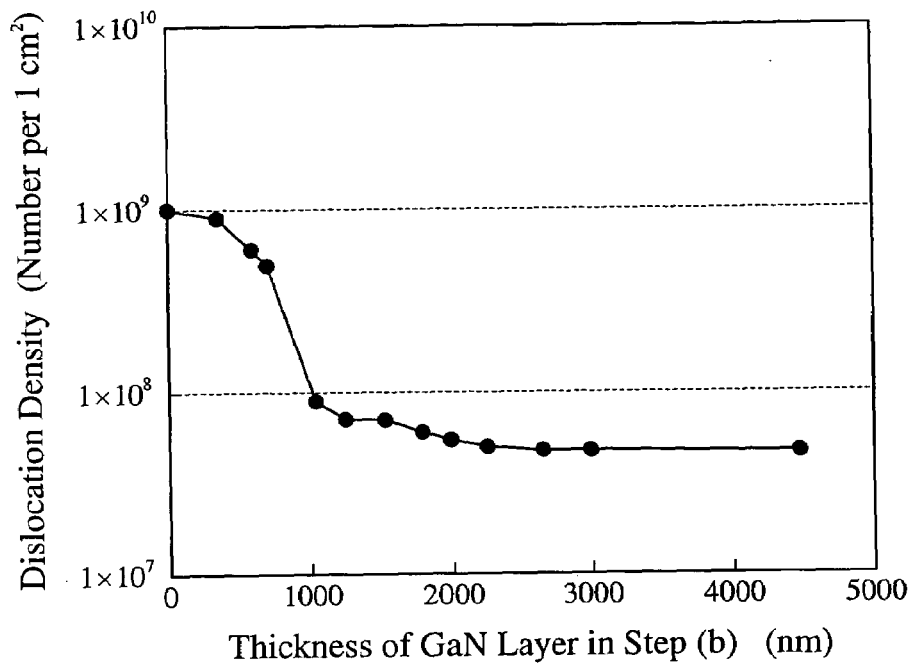
FIG. 2 is a graph showing the influence of the thickness of a GaN semiconductor layer in the step (b) on a dislocation density on a surface of the GaN semiconductor layer after the completion of the step (c)

GaN semiconductor was produced under the same conditions as in Example 1 except for changing the thickness of the GaN semiconductor layer between 0 nm and 4500 nm in the step (b). The influence of the thickness of the GaN semiconductor layer in the step (b) on a dislocation density on the surface of the GaN semiconductor after the completion of the step (c) is shown in FIG. 2. The dislocation density when the thickness of the second GaN semiconductor layer is 0 corresponds to a dislocation density on a surface of a GaN semiconductor produced by the conventional two-stage growing method. As the GaN semiconductor layer formed in the step (b) becomes thicker, the dislocation density decreases gradually; when the GaN semiconductor layer became thicker than 1000 nm, the dislocation density became lower than the minimum dislocation density ($1\times10^8$ per 1 $cm^2$) achieved under Si-free conditions in the prior invention. Further, a dislocation density of $5\times10^7$ per 1 $cm^2$ obtained when the thickness of the GaN semiconductor layer was 2250 nm was the same as the minimum dislocation density in the prior invention, which was obtained by a method comprising partially covering the substrate surface with an Si layer, and then forming fine crystal particles on the Si covering layer. As the GaN semiconductor layer became thicker, the dislocation density further decreased, and when the GaN semiconductor layer was as thick as 4500 nm, the dislocation density was minimum ($2.2\times10^7$ per 1 $cm^2$).

EXAMPLE 3

Figure 3:
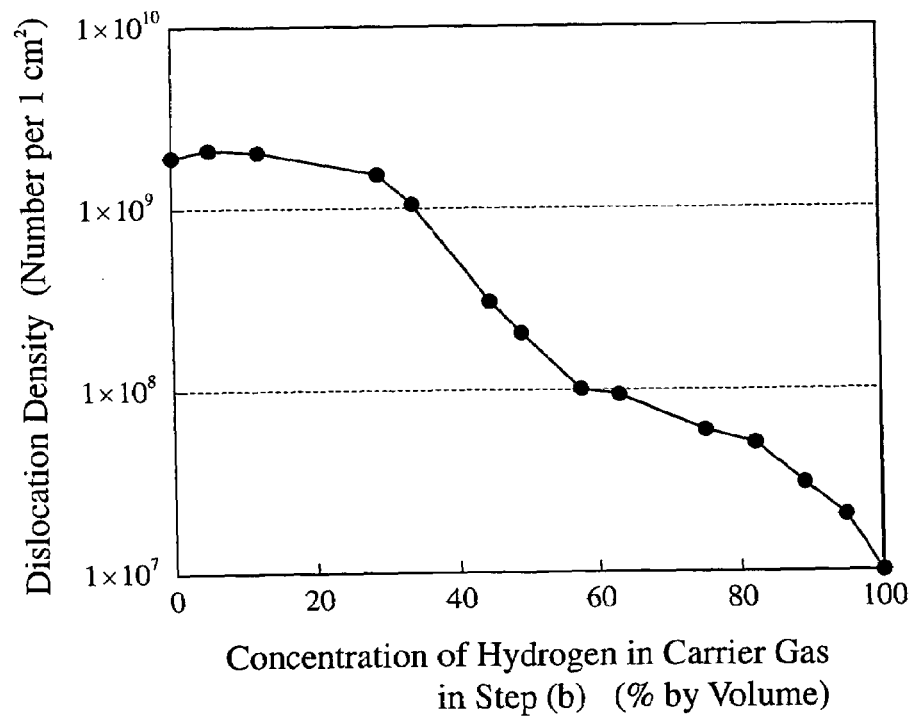
FIG. 3 is a graph showing the influence of a the concentration of hydrogen in the carrier gas in the step (b) on a dislocation density on a surface of the GaN semiconductor layer after the completion of the step (c)

A GaN semiconductor was produced under the same conditions as in Example 1 except for changing the concentration of hydrogen in a carrier gas between 0% by volume and 100% by volume in the step (b). The influence of the concentration of hydrogen in a carrier gas in the step (b) on a dislocation density on the surface of the GaN semiconductor after the completion of the step (c) is shown in FIG. 3. Though the dislocation density was $1\times10^8$ or more per 1 $cm^2$ when the concentration of hydrogen was 58% by volume or less, it was $9\times10^7$ per 1 $cm^2$ or less when the concentration of hydrogen was 63% or more by volume, and further $5\times10^7$ per 1 $cm^2$ or less when the concentration of hydrogen was 82% or more by volume.

In the case of producing a light-emitting diode (LED) having light emission in an ultraviolet region, the dislocation density should be $5\times10^7$ per 1 $cm^2$ or less to obtain a light output on a practical level of 0.1 mW or more at current of 20 mA. When the concentration of hydrogen is 82% or more by volume, this requirement is met, suitable for producing an epitaxial substrate wafer for high-luminance ultraviolet LEDs. When the concentration of hydrogen was 100% by volume, namely when the carrier gas was composed only of hydrogen, the maximum effect of reducing dislocations was obtained, resulting in as low a dislocation density as $1\times10^7$ per 1 $cm^2$.

Figure 4A:
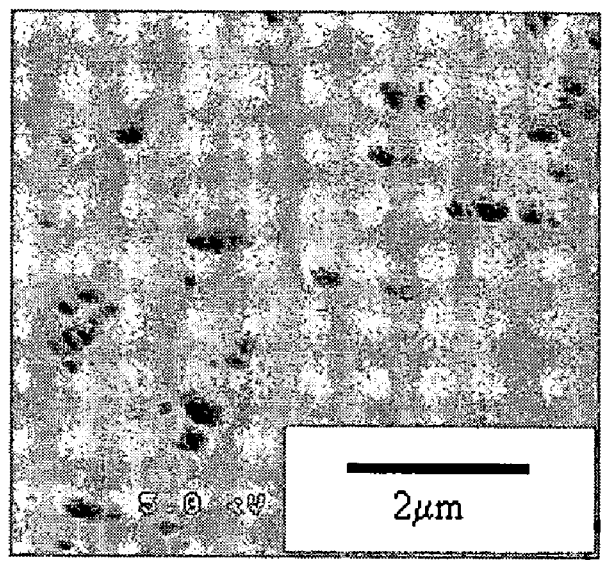
FIG. 4(a) is a scanning electron photomicrograph of a surface of a wafer at the end of the step (b), in a case where the concentration of hydrogen in the carrier gas is 29% by volume.
Figure 4B:
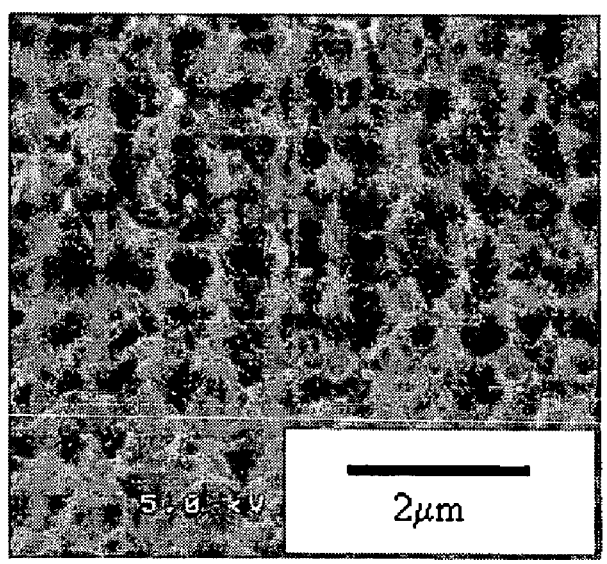
FIG. 4(b) is a scanning electron photomicrograph of a surface of a wafer at the end of the step (b), in a case where the concentration of hydrogen in the carrier gas is 100% by volume.

The growth of a GaN semiconductor layer was stopped when the step (b) was completed, and a surface of a sample (wafer) taken out of the crystal-growing apparatus was observed by a scanning electron microscope (SEM). FIG. 4 shows SEM photographs of wafer surfaces when the concentration of hydrogen in the carrier gas was 29% by volume and 100% by volume, respectively, in the step (b). Though the wafer had a substantially flat surface when the concentration of hydrogen was 29% by volume (FIG. 4(a)), there were island structures in a shape of a polygonal pyramid at a high density on the wafer surface when the concentration of hydrogen was 100% by volume (FIG. 4(b)). As is clear from this, the higher the concentration of hydrogen in a carrier gas, the more stably the nitride semiconductor island structures exist on the substrate surface, resulting in the longer existence of island structures, and thus decrease in the dislocation density.

EXAMPLE 4

A GaN semiconductor was produced under the same conditions as in Example 1 except for changing the concentration of hydrogen in a carrier gas between 0% and 100% by volume in the step (c). A dislocation density on the surface of the GaN semiconductor after the completion of the step (c) was $5\times10^7$ per 1 $cm^2$ at any concentration of hydrogen, the same as in Example 1, but it was made clear that the surface flatness largely depended on the concentration of hydrogen. The influence of the concentration of hydrogen in a carrier gas in the step (c) on the surface roughness (root-mean-square value) of the GaN semiconductor after the completion of the step (c) is shown in FIG.

5. The surface roughness (root-mean-square value) was determined from an atomic force microscopic (AFM) image in a region of 50 μm each.

Though the root-mean-square value was 25 nm or more when the concentration of hydrogen in a carrier gas was 58% or more by volume in the step (c), the root-mean-square value became 19 nm or less when the concentration of a hydrogen gas was reduced to 49% by volume or less. When a semiconductor layer having a device structure is grown on the nitride semiconductor wafer of the present invention, the wafer should have a surface roughness (root-mean-square value) of 20 nm or less. When the root-mean-square value was 20 nm or more, a semiconductor layer grown on the wafer has an extremely non-uniform thickness. In the case of device structures (quantum wells, etc.) constituted by semiconductor layers having thickness on the level of several nanometers, the requirement of surface roughness is so strict that the root-mean-square value should be 10 nm or less. This Example achieved this requirement of surface flatness by setting the concentration of hydrogen at 29% by volume or less.

Figure 5:
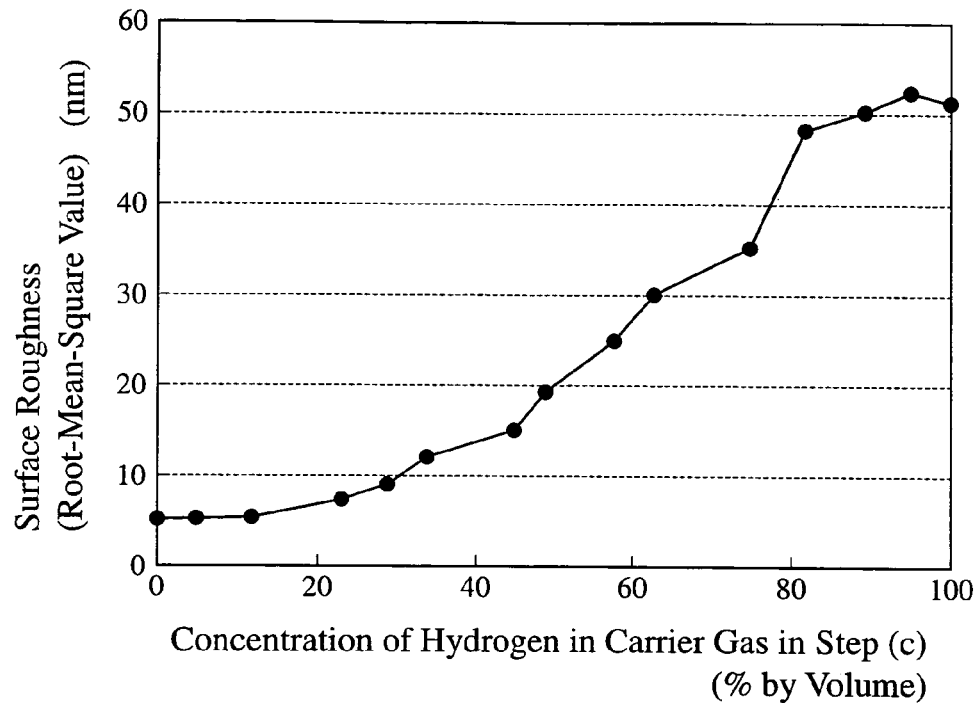
FIG. 5 is a graph showing the influence of a the concentration of hydrogen in the carrier gas in the step (c) on the surface roughness (root-mean-square value) of the GaN semiconductor after the completion of the step (c)

It is clear from FIG. 5 that the lower the concentration of hydrogen in a carrier gas in the step (c), the better the surface flatness of the GaN semiconductor after the completion of the step (c). This is because a higher concentration of nitrogen in a carrier gas accelerates the growth of crystals in a lateral direction, valleys between the island structures are berried more quickly.

EXAMPLE 5

A GaN semiconductor was produced under the same conditions as in Example 1 except for changing the growing speed of GaN semiconductor layer between 1.5 μm/hour and 8.2 μm/hour in the step (b). The influence of the growing speed of the GaN semiconductor layer in the step (b) on a dislocation density on the surface of the GaN semiconductor after the completion of the step (c) is shown in FIG. 6.

Figure 6:
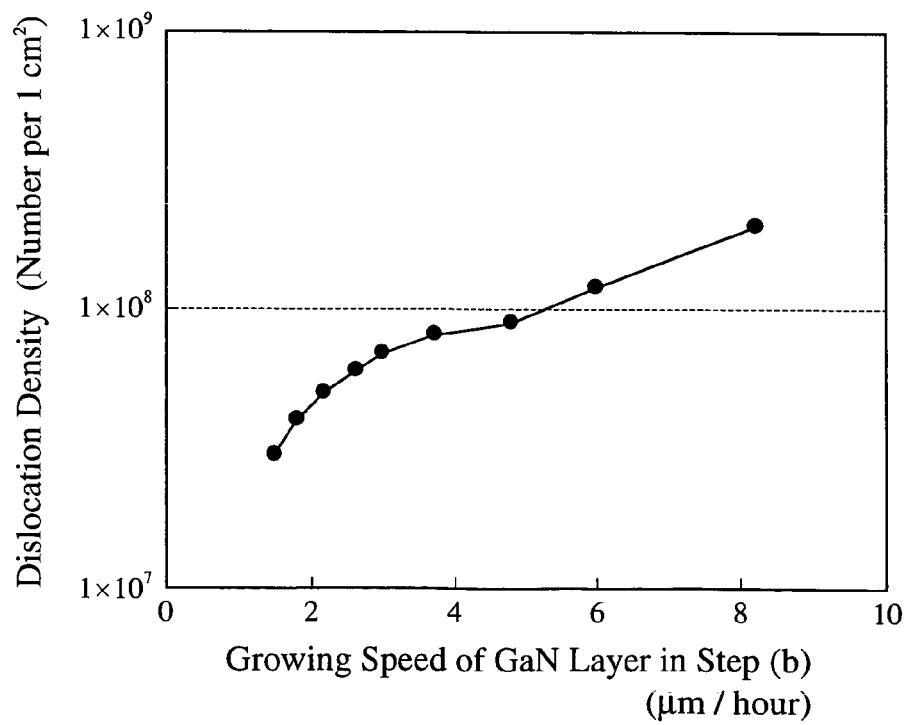
FIG. 6 is a graph showing the influence of a growing speed of the GaN semiconductor in the step (b) on a dislocation density on a surface of the GaN semiconductor layer after the completion of the step (c)

As is clear from FIG. 6, the dislocation density decreased as the growing speed decreased. This is because the lower the growing speed, the more the growth of a GaN semiconductor layer of an island structure is accelerated. The dislocation density was $9 \times 10^7$ or less per 1 cm² at a growing speed of 4.8 μm/hour or less, and it was further reduced by one digit when the growing speed became 2.6 μm/hour or less, resulting in further decrease in the dislocation density to $5 \times 10^7$ or less per 1 cm², which was applicable to ultraviolet LEDs.

EXAMPLE 6

A GaN semiconductor was produced under the same conditions as in Example 1 except for changing the growing speed of the GaN semiconductor layer between 1.5 μm/hour and 14 μm/hour in the step (c). A dislocation density on the surface of the GaN semiconductor after the completion of the step (c) was $5 \times 10^7$ per 1 cm² at any growing speed, the same as in Example 1. The influence of the growing speed of the GaN semiconductor layer in the step (c) on the surface flatness of the GaN semiconductor after the completion of the step (c) is shown in FIG. 7.

Figure 7:
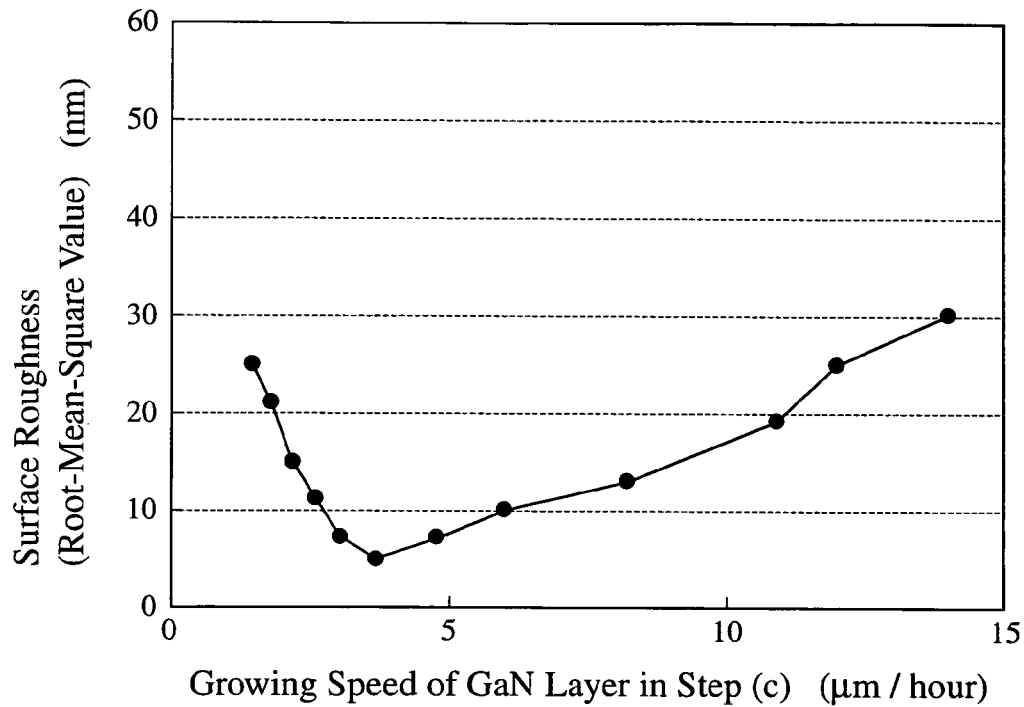
FIG. 7 is a graph showing the influence of a growing speed of the GaN semiconductor in the step (c) on the surface flatness of the GaN semiconductor layer after the completion of the step (c)

As is clear from FIG. 7, as the growing speed of the GaN semiconductor layer became lower, the island growth was accelerated, resulting in poor surface flatness of the GaN semiconductor as in Example 4. A higher growing speed suppresses island growth more, resulting in gradually decreasing surface roughness. However, because too high a growing speed makes it difficult for materials to be taken by crystals, also resulting in poor surface flatness.

As shown in FIG. 7, the surface roughness (root-mean-square value) was 20 nm or less when the growing speed of the GaN semiconductor layer in the step (c) was 2.2 to 10.9 μm/hour, and 10 nm or less when the growing speed was 3.1 to 5.8 μm/hour.

EXAMPLE 7

A GaN semiconductor was produced under the same conditions as in Example 1 except for changing pressure during the growth of a GaN semiconductor layer between 76 Torr and 815 Torr in the step (c). A dislocation density on the surface of the GaN semiconductor after the completion of the step (c) was $5 \times 10^7$ per 1 cm² at any pressure in the crystal growth, the same as in Example 1. The influence of pressure during the growth of a GaN semiconductor layer in the step (c) on the surface flatness of the GaN semiconductor after the completion of the step (c) is shown in FIG. 8.

Figure 8:
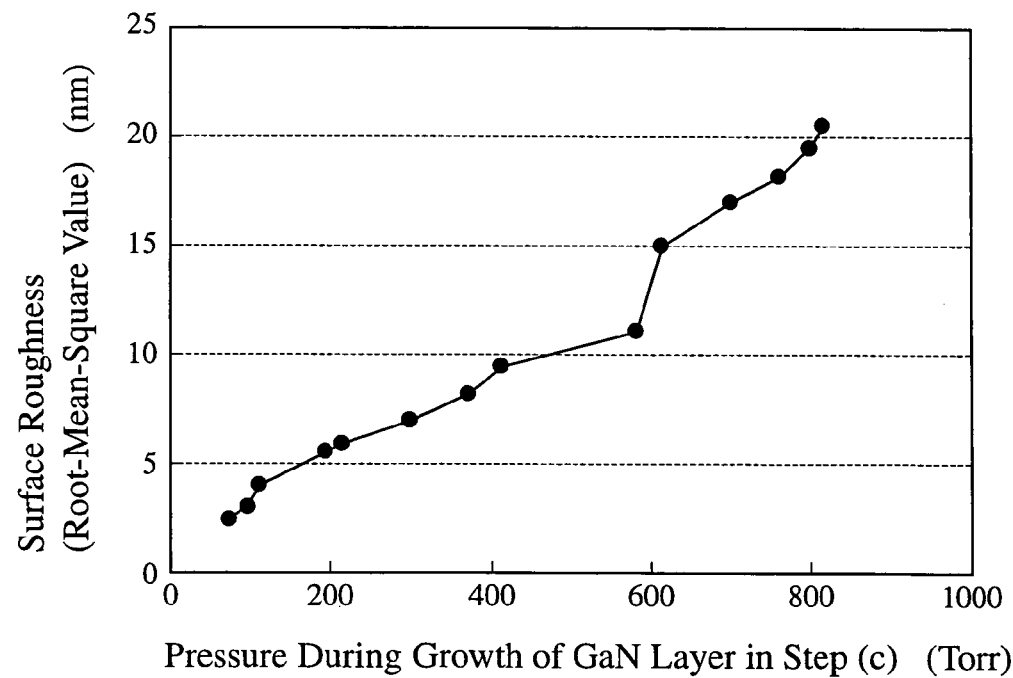
FIG. 8 is a graph showing the influence of a pressure during the growth of the GaN semiconductor layer in the step (c) on the surface flatness of the GaN semiconductor layer after the completion of the step (c)
Figure 9:
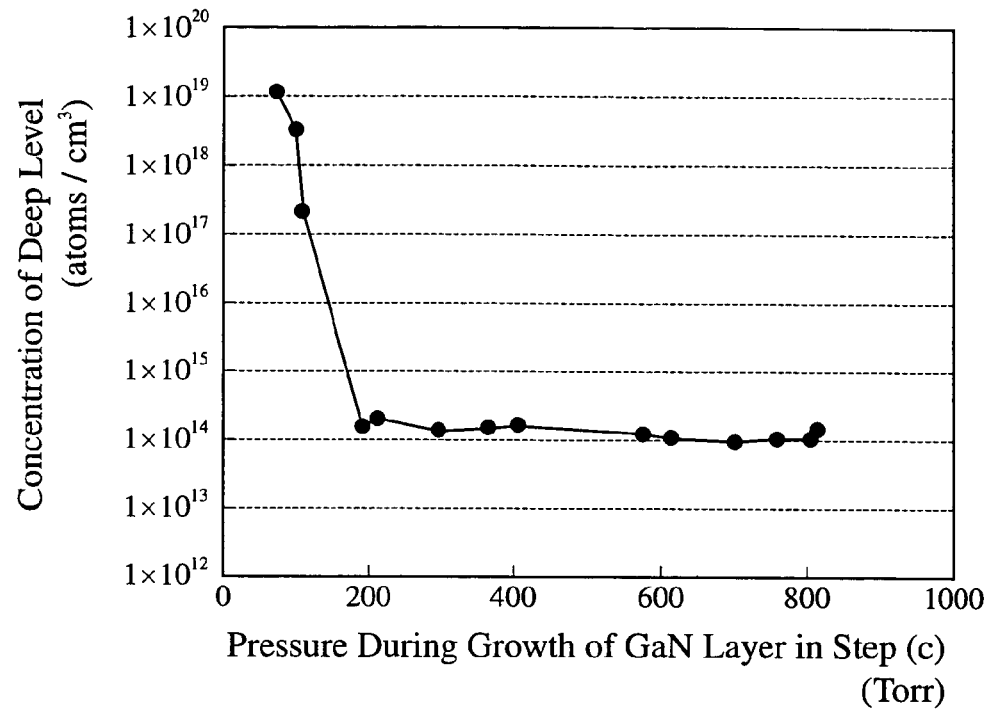
FIG. 9 is a graph showing the influence of a pressure during the growth of the GaN semiconductor layer in the step (c) on the concentration of a deep level generated in the GaN semiconductor layer.

As is clear from FIG. 8, the lower the pressure during the growth of a GaN semiconductor layer, the more the surface flattening of the GaN semiconductor was accelerated. The surface roughness (root-mean-square value) was 19.5 nm or less at 800 Torr or less, and 9.4 nm or less at 410 Torr or less. However, the evaluation of electric characteristics of a wafer after the growth of a GaN semiconductor layer revealed that a deep level occurred at a high density when pressure in the crystal growth was less than 112 Torr, as shown in FIG. 9. If a crystal had a deep level at such a high density, there would be undesirable phenomena for devices that it functions as a current leak source in field effect transistors (FETs), non-luminescent center in LEDs, etc. Accordingly, the pressure during the growth of a GaN semiconductor layer in the step (c) should be 112 Torr or more, at which the deep level is suppressed to the level of $10^{17}$ atoms/cm³ or less, more preferably 195 Torr or more, at which the deep level is suppressed to the level of $10^{14}$ atoms/cm³ or less. In sum, the pressure during the growth of a GaN semiconductor layer in the step (c) is preferably 112 to 800 Torr, more preferably 195 to 410 Torr.

EXAMPLE 8

Figure 10:
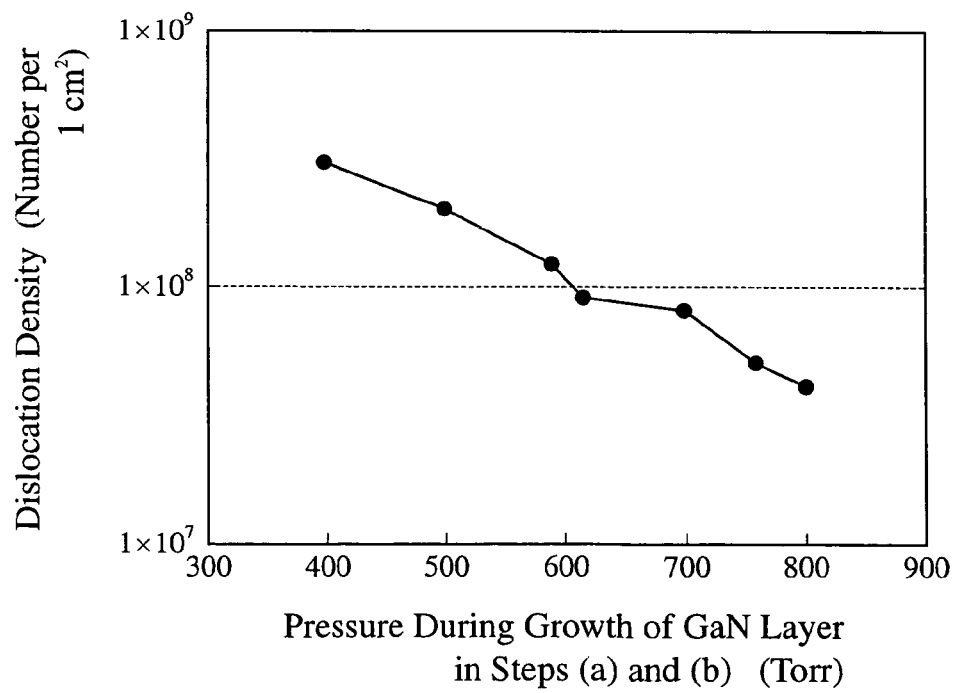
FIG. 10 is a graph showing the influence of a pressure during the growth of the GaN semiconductor layer in the steps (a) and (b) on a dislocation density on a surface of the GaN semiconductor layer after the completion of the step (c)

A GaN semiconductor was produced under the same conditions as in Example 1 except for changing the pressure during the growth of a GaN semiconductor layer between 400 Torr and 800 Torr in the steps (a) and (b). The influence of pressure in the crystal growth in the steps (a) and (b) on a dislocation density on the surface of the GaN semiconductor after the completion of the step (c) is shown in FIG. 10.

The higher the pressure in the crystal growth in the step (a), the lower the density of island-shaped, fine crystal particles, resulting in a lower density of a GaN semiconductor layer of an island structure formed thereon, and thus more difficulty in having a flat GaN semiconductor layer. Also, the higher the pressure in the crystal growth in the step (b), the more the growth of a GaN semiconductor layer of an island structure is accelerated. Because of these effects, the higher the pressure in the crystal growth in the steps (a) and (b), the longer the island structure is kept, resulting in a lower dislocation density. When the pressure in the crystal growth was 615 Torr or more, the dislocation density was $9 \times 10^7$ or less per 1 cm².

EXAMPLE 9

Figure 11:
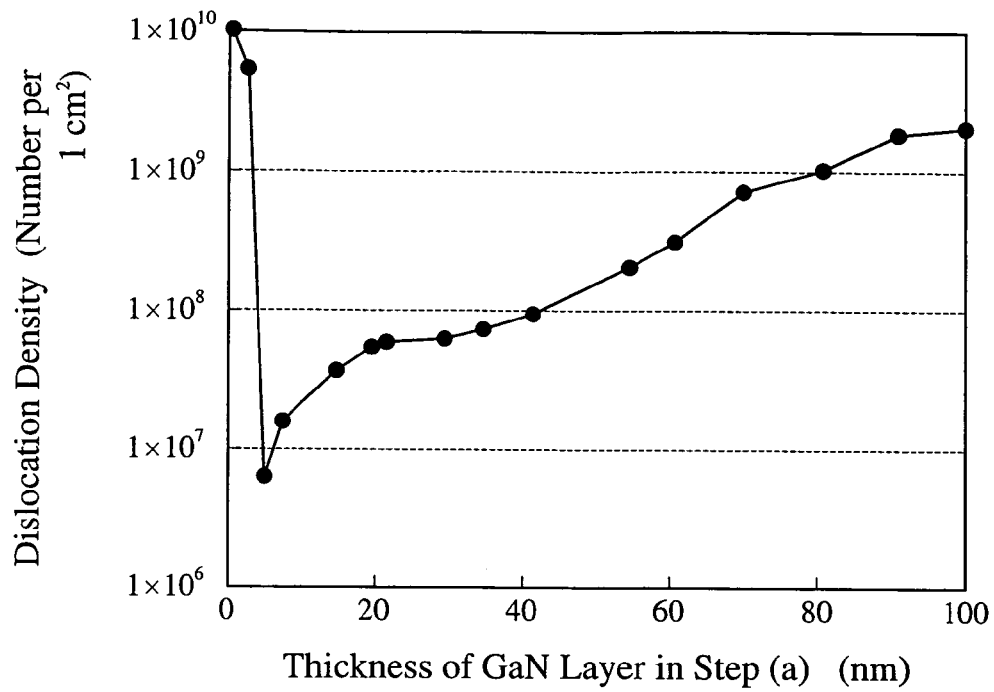
FIG. 11 is a graph showing the influence of a thickness of the GaN semiconductor layer in the step (a) on a dislocation density on a surface of the GaN semiconductor layer after the completion of the step (c)

A GaN semiconductor was produced under the same conditions as in Example 1 except for changing the thickness of the GaN semiconductor layer between 1 nm and 100 nm in the step (a). The influence of the thickness of the GaN semiconductor layer in the step (a) on a dislocation density on the surface of the GaN semiconductor after the completion of the step (c) is shown in FIG. 11. Though the GaN semiconductor layer became thinner in the step (a), the dislocation density decreased gradually. However, in a case where the thickness of the GaN semiconductor layer was 3 nm or less, as the GaN semiconductor layer became thinner, the dislocation density increased drastically.

As shown in Example 8, the lower the concentration of initial fine crystal particles, the less the island structure became flat, resulting in decreased dislocations. As shown in FIG. 11, because a thinner GaN semiconductor layer provides initial fine crystal particles at a lower density in the step (a), the reduction of the thickness of the GaN semiconductor layer from 100 nm to 5 nm in the step (a) leads to the decrease of dislocation density from $2 \times 10^9$ per 1 $cm^2$ to $6 \times 10^6$ per 1 $cm^2$. It is presumed that the dislocation density drastically increased when the thickness of the GaN semiconductor layer was 3 nm or less, because the GaN semiconductor layer was so thin that all of the GaN semiconductor layer was evaporated in the heat treatment step, resulting in no fine crystal particles remaining on the surface.

As is clear from FIG. 11, the dislocation density was less than $1 \times 10^8$ per 1 $cm^2$ when the thickness of the GaN semiconductor layer was 5 to 42 nm in the step (a), and $5 \times 10^7$ or less per 1 $cm^2$ necessary for ultraviolet LEDs when the thickness of the GaN semiconductor layer in the step (a) was 5 to 22 nm.

EXAMPLE 10

A GaN semiconductor was produced under the same conditions as in Example 1 except for changing the thickness of the GaN semiconductor layer between 300 nm and 12,000 nm in the step (c). A dislocation density on the surface of the GaN semiconductor after the completion of the step (c) was $5 \times 10^7$ per 1 $cm^2$ at any thickness, the same as in Example 1. The influence of the thickness of the GaN semiconductor layer in the step (c) on the surface roughness (root-mean-square value) of the GaN semiconductor surface after the completion of the step (c) is shown in FIG. 12.

Figure 12:
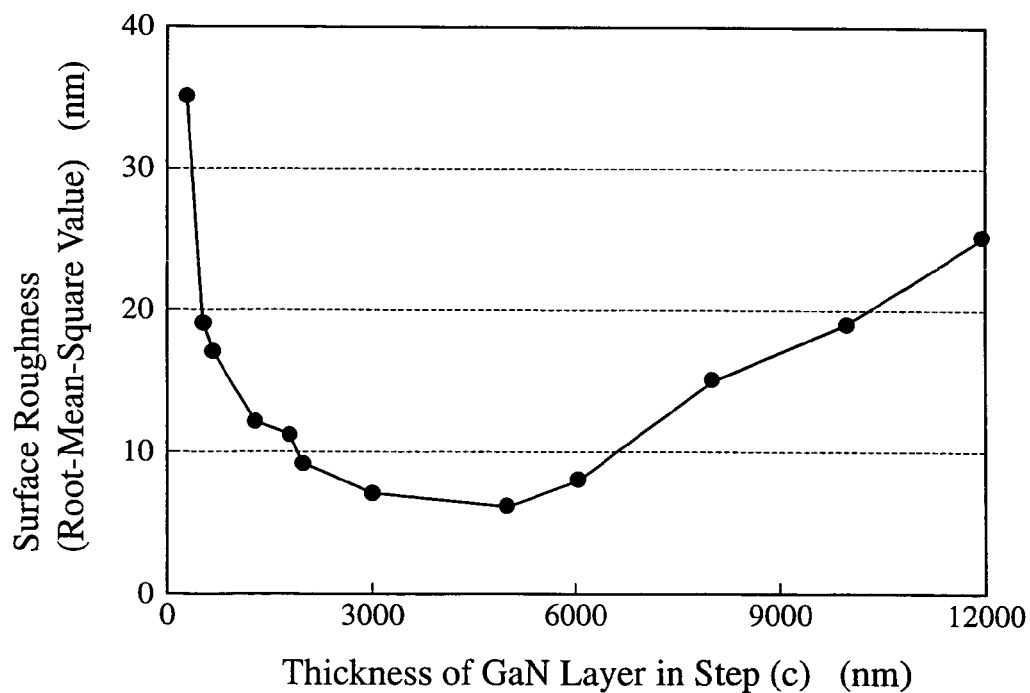
FIG. 12 is a graph showing the influence of a thickness of the GaN semiconductor layer in the step (c) on the surface flatness of the GaN semiconductor after the completion of the step (c)

As is clear from FIG. 12, when the thickness of the GaN semiconductor layer in the step (c) was 500 to 10,000 nm, a GaN semiconductor having a substantially flat surface (root-mean-square value<20 nm) was obtained, and when it was 2,000 to 6,000 nm a GaN semiconductor having a flatter surface (root-mean-square value<10 nm) was obtained.

When a GaN semiconductor layer is grown on the GaN semiconductor layer of an island structure, the semiconductor surface gradually becomes flat, though the semiconductor has poor surface flatness when the GaN semiconductor layer grown in the step (c) is too thick. The reason of the deterioration of a surface flatness due to increase in the thickness appears to be due to the fact that increase in the thickness leads to the warpage of the substrate, thereby making the growing conditions deviate from the optimum ones.

EXAMPLE 11

Figure 13:
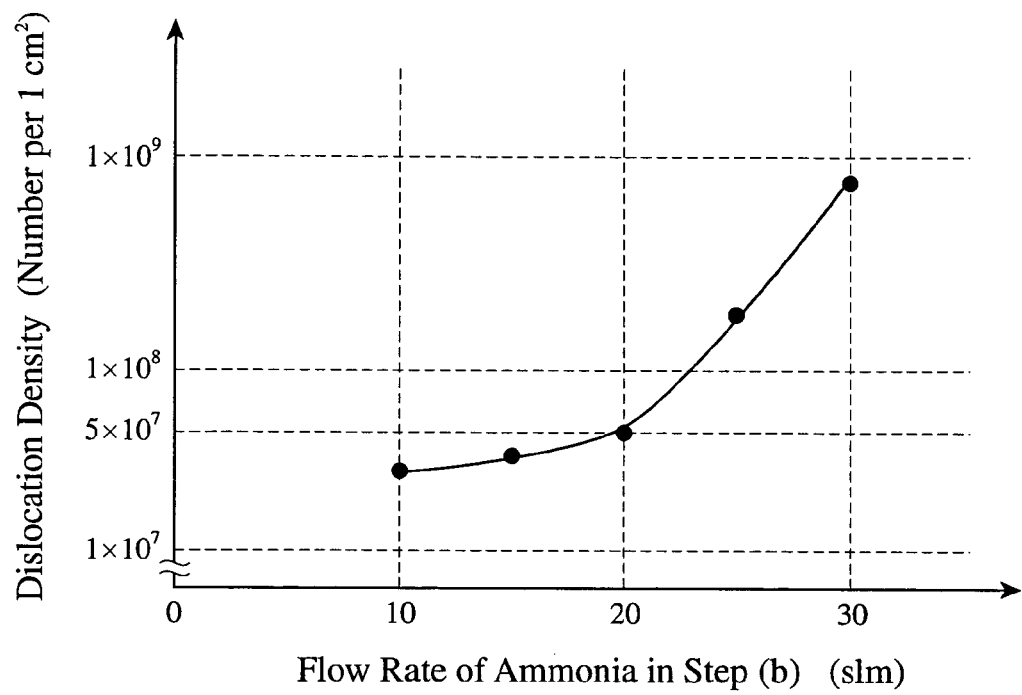
FIG. 13 is a graph showing the influence of the flow rate of ammonia in the step (b) on a dislocation density on a surface of the GaN semiconductor layer after the completion of the step (c)

A GaN semiconductor was produced under the same conditions as in Example 1 except for changing the flow rate of ammonia between 10 slm and 30 slm in the step (b). The influence of the flow rate of ammonia in the step (b) on a dislocation density on the surface of the GaN semiconductor after the completion of the step (c) is shown in FIG. 13. When the flow rate of ammonia in the step (b) was higher than 20 slm, the dislocation density was higher than the value ($5 \times 10^7$ per 1 $cm^2$) in Example 1, though when it was lower than 20 slm the dislocation density decreased. As is clear from FIG. 13, when the flow rate of ammonia in the step (b) was 20 slm or less, namely equal to or lower than the flow rate of ammonia in the step (c), a dislocation density of $5 \times 10^7$ or less per 1 $cm^2$ necessary for ultraviolet LEDs was obtained.

EXAMPLE 12

Figure 14:
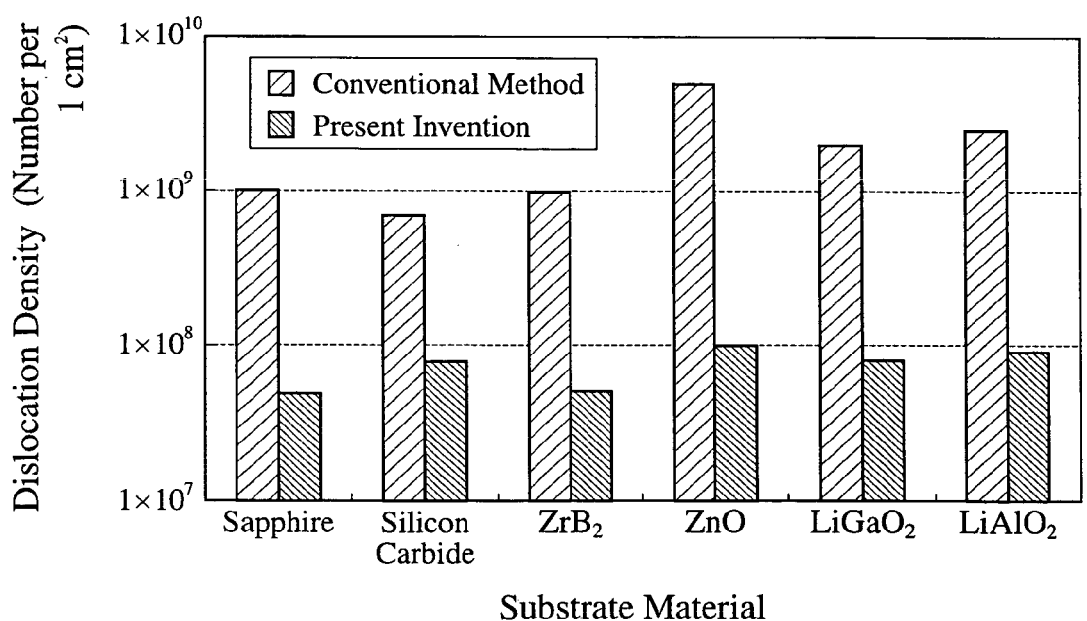
FIG. 14 is a graph showing the influence of a substrate material on a dislocation density on a surface of the GaN semiconductor after the completion of the step (c)

A GaN semiconductor was formed on each substrate under the same conditions as in Example 1 except for using a single crystal substrate of silicon carbide, silicon, $ZrB_2$, ZnO, $LiGaO_2$ or $LiAlO_2$. A dislocation density after the completion of the step (c) in each case is shown in FIG. 14. In any case, the dislocation density on the surface of the GaN semiconductor layer was lower than that of the GaN semiconductor layer produced by the conventional two-stage growing method, indicating that the method of the present invention is effective for the growth of a nitride semiconductor layer even on other substrates than a sapphire substrate.

EXAMPLE 13

Figure 15:
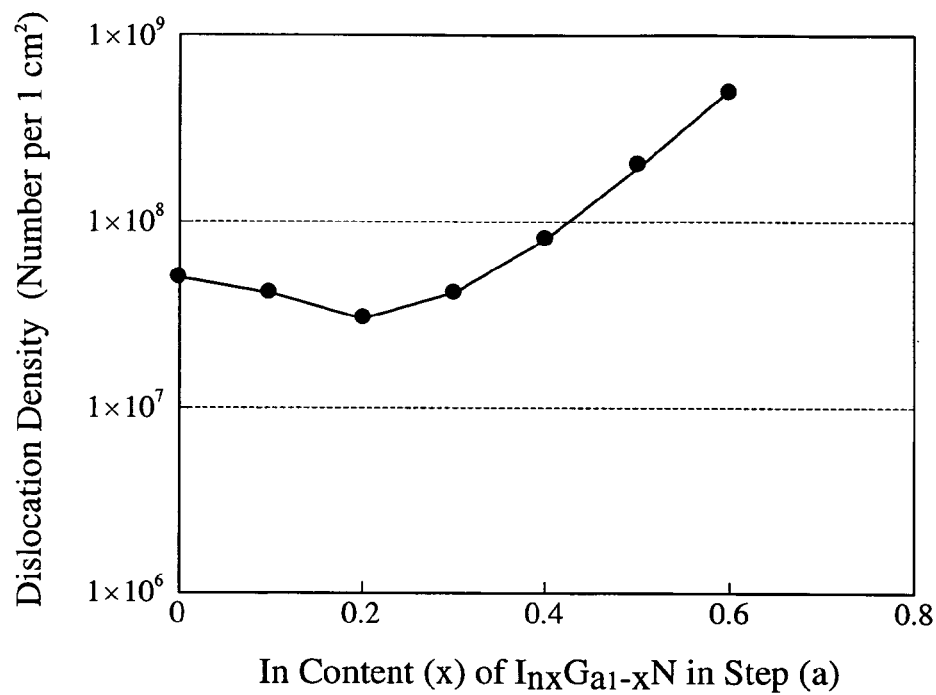
FIG. 15 is a graph showing the influence of the composition of InGaN in the step (a) on a dislocation density on a surface of the GaN semiconductor after the completion of the step (c)

A GaN semiconductor layer was grown on an InGaN semiconductor layer under the same conditions as in Example 1, except for growing an InGaN semiconductor layer in place of the GaN semiconductor layer as a low-temperature buffer layer in the step (a) in Example 1, with trimethyl indium (TMI) as an In source added to a growing material. FIG. 15 shows the dependence of a dislocation density in the step (a) on the In content (x) in $In_xGa_{1-x}N$. The dislocation density was lower than in Example 1 when the In content was in a range of 0.3 or less. This is due to the fact that the addition of easily vaporizable In accelerates the reevaporation of a low-temperature buffer layer, resulting in a lower density of fine crystal particles. The reason why the dislocation density was higher than in Example 1 when the In content was 0.4 or more appears to be due to the fact that lattice mismatch increased between the InGaN semiconductor layer as a low-temperature buffer layer and the GaN semiconductor layer formed thereon in the step (b), resulting in the generation of new dislocations.

EXAMPLE 14

$In_xAl_yGa_zN$ ($x \geq 0$, $y \geq 0$, $z \geq 0$, $x+y+z=z=1$) was grown as a semiconductor crystal layer in the steps (a), (b) and (c) in Example 1. The growth of $In_xAl_yGa_zN$ was carried out by using trimethyl aluminum (TMA) in addition to TMG and TMI as III-group materials, with the ratios of these materials changed. As a result, as low dislocation as in GaN in Example 1 was achieved in the entire composition range. However, the heat treatment temperature in the step (a) and the growing temperature in the steps (b) and (c) were changed from those in Example 1, to decrease dislocation depending on the composition of a nitride semiconductor. Specifically, in the case of x (content of In)$\geq 0.1$, the heat treatment temperature in the step (a) and the growing temperature in the steps (b) and (c) were 700° C. to 900° C. Also, in the case of x<0.1 and y (content of Al)$\leq 0.5$, the heat treatment temperature in the step (a) and the growing temperature in the steps (b) and (c) were 900° C. to 1,200° C. Further, in the case of x<0.1 and y>0.5, the heat treatment temperature in the step (a) and the growing temperature in the steps (b) and (c) were 1,200° C. to 1,300° C.

EXAMPLE 15

A GaN semiconductor was produced on a substrate under the same conditions as in Example 1 (all layer undoped), except for doping each GaN semiconductor layer formed in the steps (a) to (c) with silicon in a range of $5\times10^{17}$ to $1\times10^{20}$ atoms/cm$^3$. A silane (SiH$_4$) diluted with hydrogen to a concentration of 5 ppm was used as a doping material. As a result, it was found that the dislocation density and the surface flatness were not deteriorated as long as the doping concentration was $5\times10^{19}$ atoms/cm$^3$ or less. When the doping concentration was higher than $5\times10^{19}$ atoms/cm$^3$, the surface roughness of the GaN semiconductor after the completion of the step (c) exceeded 20 nm by a root-mean-square value.

The same experiment conducted with doping with oxygen, iron, zinc or magnesium confirmed that the dislocation density and the surface flatness were not deteriorated in all cases as long as the doping concentration was $5\times10^{19}$ atoms/cm$^3$ or less.

EXAMPLE 16, COMPARATIVE EXAMPLE 1

Figure 16:
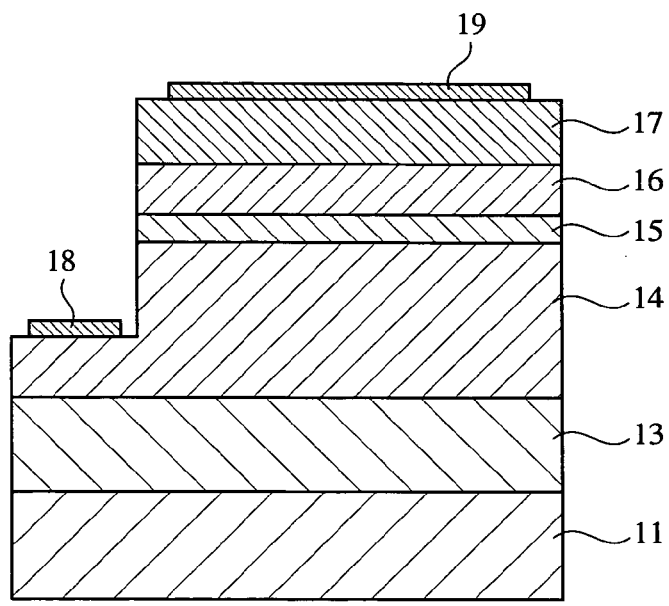
FIG. 16 is a schematic cross-sectional view showing one structural example of the semiconductor device of the present invention (blue LED)

As shown in FIG. 16, an undoped GaN semiconductor layer 13 having a surface dislocation density of $5\times10^7$ per cm$^2$ was formed on a sapphire substrate 11 in the same manner as in Example 1. Successively formed on the undoped GaN semiconductor layer 13 were an n-GaN semiconductor layer 14 having a thickness of 3 $\mu$m, an InGaN/GaN multiple-quantum-well layer 15 having a thickness of 2 nm in an InGaN semiconductor layer and 5 nm in a GaN semiconductor layer, a p-Al$_{0.1}$Ga$_{0.9}$N layer 16 having a thickness of 20 nm, and a p-GaN contact layer 17 having a thickness of 0.2 $\mu$m, to produce a blue LED wafer of a nitride semiconductor. A surface portion of the resultant wafer was partially removed by reactive ion etching (RIE) to expose part of an n-GaN semiconductor layer 14, and an n-electrode (Ti/Al electrode) 18 was then formed. Further, a p-electrode (Ni/Au electrode) 19 was formed on the p-GaN contact layer 17 to produce an LED of Example 16.

An LED of Comparative Example 1 was produced in the same manner as in this Example except for forming an undoped GaN semiconductor layer 13 having a dislocation density of $1\times10^9$ per 1 cm$^2$ by the conventional two-stage growing method.

Though both LEDs of Example 16 and Comparative Example 1 emitted light at a wavelength of 460 nm by supplying current of 20 mA, the LED of Example 15 had a light output of 13 mW, while the LED of Comparative Example 1 had a light output of 5 mW. This indicates that a light-emitting device formed from the undoped GaN semiconductor layer having a low dislocation density obtained by the method of the present invention has much better characteristics than that formed from the undoped GaN semiconductor layer obtained by the conventional two-stage growing method.

EXAMPLE 17, COMPARATIVE EXAMPLE 2

Figure 17:
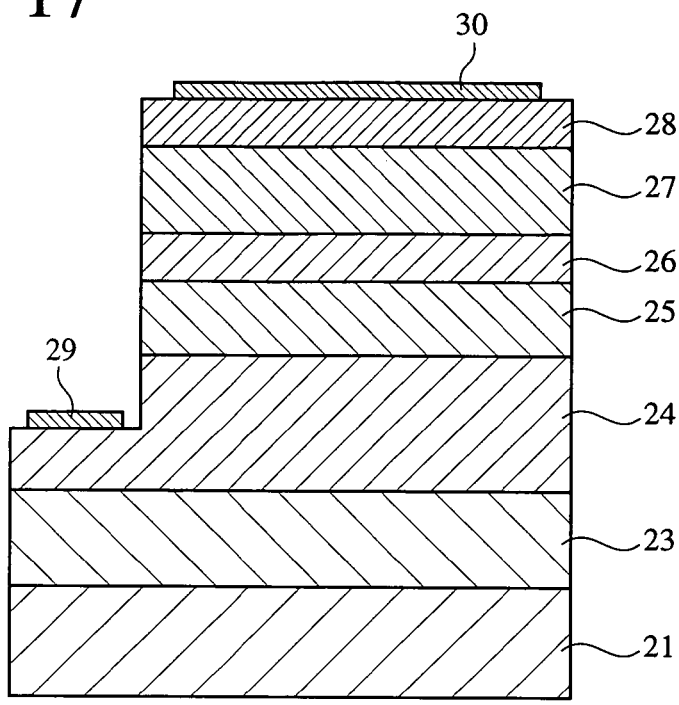
FIG. 17 is a schematic cross-sectional view showing another structural example of the semiconductor device of the present invention (ultraviolet LED)

As shown in FIG. 17, an n-GaN semiconductor layer 23 having a surface dislocation density of $5\times10^7$ per 1 cm$^2$ was formed on a sapphire substrate 21 in the same manner as in Example 14. Successively formed on the n-GaN semiconductor layer 23 were an n-GaN semiconductor layer 24 having a thickness of 2 $\mu$m, an n-Al$_{0.15}$Ga$_{0.85}$N layer 25 having a thickness of 50 nm, a GaN/Al$_{0.1}$Ga$_{0.9}$N multiple-quantum-well layer 26 having a thickness of 2 nm in a GaN semiconductor layer and 5 nm in Al$_{0.1}$Ga$_{0.9}$N, a p-Al$_{0.15}$Ga$_{0.85}$N layer 27 having a thickness of 100 $\mu$m, and a p-Al$_{0.05}$Ga$_{0.95}$N contact layer 28 having a thickness of 5 nm, to produce a blue LED wafer of nitride semiconductor. A surface portion of the resultant wafer was partially removed by RIE to expose part of the n-GaN semiconductor layer 24, and an n-electrode (Ti/Au electrode) 29 was then formed. Further, a p-electrode (Ni/Au electrode) 30 was formed on the p-Al$_{0.05}$Ga$_{0.95}$N contact layer 28, to produce the LED of Example 17.

The LED of Comparative Example 2 was produced in the same manner as in this Example, except for forming the n-GaN semiconductor layer 23 having a dislocation density of $1\times10^9$ per 1 cm$^2$ by the conventional two-stage growing method.

Though both LEDs of Example 17 and Comparative Example 2 emitted light at a wavelength of 360 nm by supplying current of 20 mA, the LED of Example 17 had a light output of 1.5 mW, while the LED of Comparative Example 2 had a light output of 0.05 mW. This indicates that a light-emitting device formed from the n-GaN semiconductor layer having a low dislocation density obtained by the method of the present invention had much better characteristics than that formed from the n-GaN semiconductor layer obtained by the conventional two-stage growing method.

EXAMPLE 18, COMPARATIVE EXAMPLE 3

Figure 18:
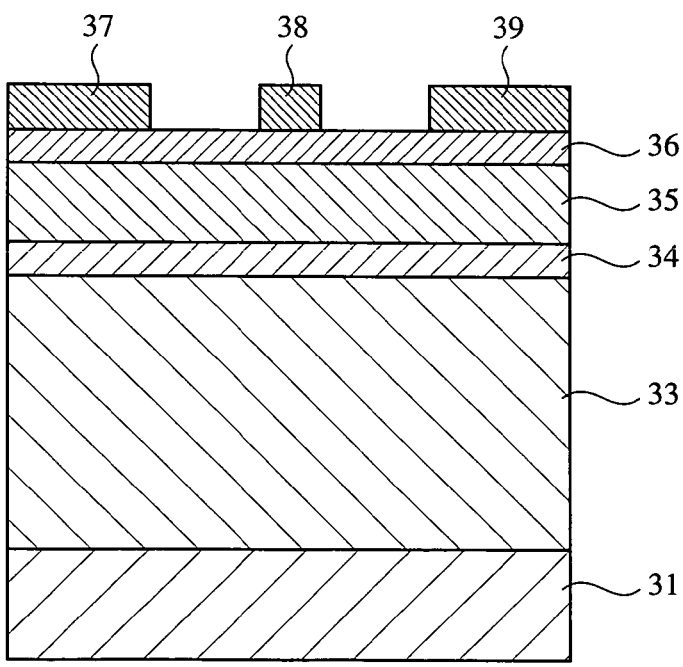
FIG. 18 is a schematic cross-sectional view showing a further structural example of the semiconductor device of the present invention (high-electron-mobility transistor).

As shown in FIG. 18, an undoped GaN semiconductor layer 33 having a surface dislocation density of $5\times10^7$ per 1 cm$^2$ was formed on a sapphire substrate 31 in the same manner as in Example 1. Successively formed on the undoped GaN semiconductor layer 33 were an undoped Al$_{0.25}$Ga$_{0.75}$N layer 34 having a thickness of 3 nm, an n-Al$_{0.25}$Ga$_{0.75}$N layer 35 having a thickness of 20 nm, and an undoped Al$_{0.25}$Ga$_{0.75}$N layer 36 having a thickness of 5 nm, to produce a nitride semiconductor wafer. A source electrode 37, a gate electrode 38 and a drain electrode 39 were formed on the resultant wafer by a photolithography method and a vacuum vapor deposition method, to produce a high-electron-mobility transistor (HEMT) of Example 18.

The HEMT of Comparative Example 3 was produced in the same manner as in this Example, except for using an undoped GaN semiconductor layer 33 (dislocation density: $1\times10^9$ per 1 cm$^2$) formed by the conventional two-stage growing method.

The examination of the HEMTs of Example 18 and Comparative Example 3 with respect to DC conductance characteristics revealed that the HEMT of Example 18 had transconductance of 250 mS/mm, while the HEMT of Comparative Example 3 had transconductance of 75 mS/mm. Because of a lower dislocation density on the surface of the undoped GaN semiconductor than the HEMT of Comparative Example 3, the HEMT of Example 18 had decreased leakage of gate current, thereby having improved controllability of a two-dimensional electron density at gate voltage.

Though the present invention has been explained in detail referring to Examples above, the present invention is not restricted thereto and may be subjected to various modifications within the scope of the present invention. For instance, though explanation has been mainly on epitaxial growing by the MOVPE method, the present invention is not restricted thereto, and nitride semiconductor crystals can be grown by an HVPE method.

As described above in detail, the method for producing a nitride semiconductor crystal according to the present invention can form a nitride semiconductor crystal layer having a low dislocation density on the entire substrate. Accordingly, it is possible to produce nitride semiconductor devices having excellent device characteristics and stability, using the nitride semiconductor crystal obtained by the production method of the present invention. Further, it is possible to avoid the contamination of crystals by a high concentration of an Si source gas, which is the problem of the prior invention.

What is claimed is:

1. A method for producing a nitride semiconductor comprising growing at least first to third nitride semiconductor layers on a substrate; said first nitride semiconductor layer being grown at 400–600° C.; and said second and third nitride semiconductor layers being grown on said first nitride semiconductor layer at 700–1,300° C. after heat-treating said first nitride semiconductor layer at 700–1,300° C.; using a carrier gas supplied near said substrate together with a starting material gas, the carrier gas being a hydrogen/nitrogen mixture gas containing 63% or more by volume of hydrogen during growing said second nitride semiconductor layer, and a hydrogen/nitrogen mixture gas containing 50% or more by volume of nitrogen during growing said third nitride semiconductor layer; and said second nitride semiconductor layer being formed to a thickness of more than 1 μm.

2. The method for producing a nitride semiconductor according to claim 1, wherein the thickness of said second nitride semiconductor layer is 2.25 μm or more.

3. The method for producing a nitride semiconductor according to claim 1 or 2, wherein a carrier gas used to grow said second nitride semiconductor layer is a hydrogen/nitrogen mixture gas containing 82% or more by volume of hydrogen.

4. The method for producing a nitride semiconductor according to any one of claims 1 to 3, wherein a carrier gas used to grow said third nitride semiconductor layer is a hydrogen/nitrogen mixture gas containing 70% or more by volume of nitrogen.

5. The method for producing a nitride semiconductor according to any one of claims 1 to 4, wherein the growing speed of said second nitride semiconductor layer is 4.8 μm/hour or less.

6. The method for producing a nitride semiconductor according to any one of claims 1 to 5, wherein the growing speed of said third nitride semiconductor layer is 2.2 to 10.9 μm/hour.

7. The method for producing a nitride semiconductor according to any one of claims 1 to 6, wherein the pressure during the growth of said third nitride semiconductor layer is 112 to 800 Torr.

8. The method for producing a nitride semiconductor according to any one of claims 1 to 7, wherein the pressure during the growth of said first and second nitride semiconductor layers is 615 Torr or more.

9. The method for producing a nitride semiconductor according to any one of claims 1 to 8, wherein the thickness of said first nitride semiconductor layer is 5 to 42 nm.

10. The method for producing a nitride semiconductor according to any one of claims 1 to 9, wherein the thickness of said third nitride semiconductor layer is 500 to 10,000 nm.

11. The method for producing a nitride semiconductor according to any one of claims 1 to 10, wherein the difference in a growing temperature between said second nitride semiconductor layer and said third nitride semiconductor layer is 100° C. or less.

12. The method for producing a nitride semiconductor according to any one of claims 1 to 11, wherein a flow rate of ammonia supplied as a nitrogen source to grow said second nitride semiconductor layer is equal to or less than that of ammonia supplied to grow said third nitride semiconductor layer.

13. The method for producing a nitride semiconductor according to any one of claims 1 to 12, wherein said substrate is made of a single crystal of sapphire, silicon carbide, silicon, $ZrB_2$, ZnO, $LiGaO_2$ or $LiAlO_2$.

14. The method for producing a nitride semiconductor according to any one of claims 1 to, wherein each of said first to third nitride semiconductor layers is made of $In_xAl_yGa_zN$ ($x \geq 0$, $y \geq 0$, $z \geq 0$, $x+y+z=1$).

15. The method for producing a nitride semiconductor according to any one of claims 1 to 14, wherein at least one of said first to third nitride semiconductor layers is undoped, or doped with silicon, oxygen, iron, zinc or magnesium at a doping concentration of $5 \times 10^{19}$ atoms or less per 1 $cm^3$.

* * * * *